(12) United States Patent
Nomoto et al.

(10) Patent No.: US 9,379,063 B2
(45) Date of Patent: Jun. 28, 2016

(54) SEMICONDUCTOR DEVICE AND SEMICONDUCTOR CHIP

(71) Applicant: PS4 Luxco S.a.r.l., Luxembourg (LU)

(72) Inventors: Keisuke Nomoto, Tokyo (JP); Toru Ishikawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/803,900

(22) Filed: Jul. 20, 2015

(65) Prior Publication Data

US 2015/0325521 A1   Nov. 12, 2015

Related U.S. Application Data

(63) Continuation of application No. 13/587,724, filed on Aug. 16, 2012, now Pat. No. 9,087,555.

(30) Foreign Application Priority Data

Aug. 31, 2011   (JP) .................................. 2011-188141

(51) Int. Cl.
| | |
|---|---|
| H01L 23/48 | (2006.01) |
| H01L 23/538 | (2006.01) |
| H01L 25/065 | (2006.01) |
| G11C 5/02 | (2006.01) |
| G11C 11/4093 | (2006.01) |
| G11C 5/04 | (2006.01) |
| H01L 21/50 | (2006.01) |

(52) U.S. Cl.
CPC .............. *H01L 23/5384* (2013.01); *G11C 5/02* (2013.01); *G11C 5/04* (2013.01); *G11C 11/4093* (2013.01); *H01L 23/538* (2013.01); *H01L 25/0657* (2013.01); *G11C 2207/105* (2013.01); *H01L 21/50* (2013.01); *H01L 2224/16* (2013.01); *H01L 2224/16145* (2013.01); *H01L 2225/06513* (2013.01); *H01L 2225/06517* (2013.01); *H01L 2225/06541* (2013.01); *H01L 2225/06562* (2013.01)

(58) Field of Classification Search
CPC .................................................... H01L 23/5384
See application file for complete search history.

(56) References Cited

U.S. PATENT DOCUMENTS

2011/0087811 A1* 4/2011 Kondo ...................... G06F 1/12
                                                                710/71

* cited by examiner

*Primary Examiner* — William Harriston
(74) *Attorney, Agent, or Firm* — Kunzler Law Group

(57) ABSTRACT

The present invention is applicable to a semiconductor device having a plurality of chips being stacked with a TSV structure in which adjacent ones of the chips are connected to each other via a plurality of through electrodes. Each of the chips includes a plurality of TSV array portions provided so as to correspond to a plurality of channels. The TSV array portions include a TSV array portion that contributes to an input and an output depending upon the number of the chips being stacked, and a pass-through TSV array portion that is not connected to an input/output circuit.

16 Claims, 9 Drawing Sheets

FIG. 1
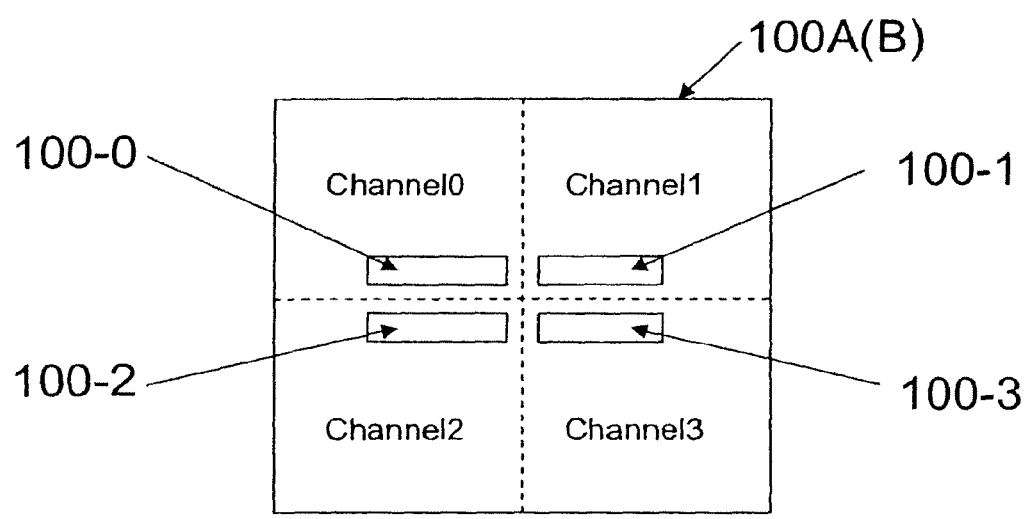
(a)
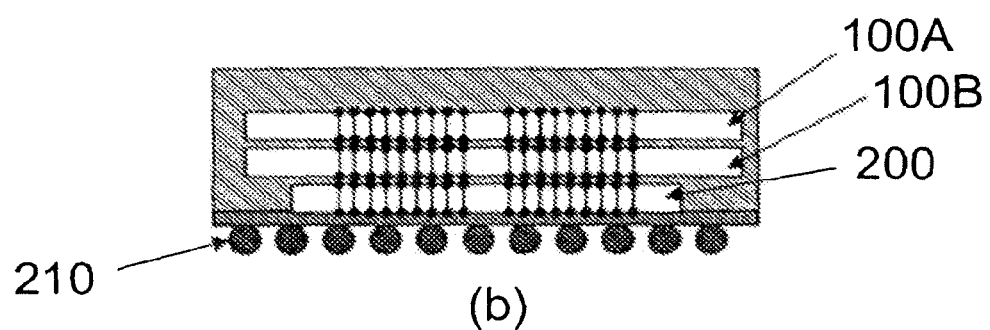
(b)

FIG. 2 RELATED ART
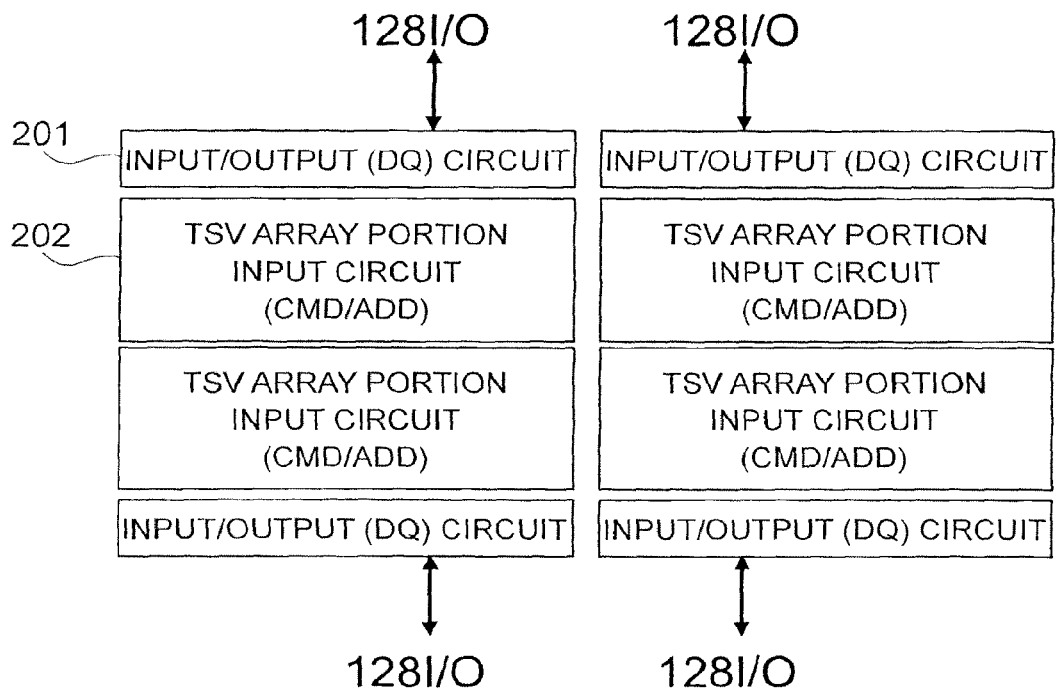
(a)
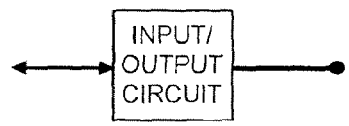
(b)
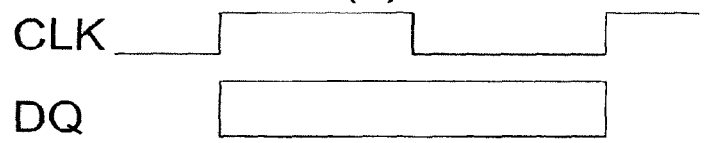
(c)

FIG. 3 RELATED ART
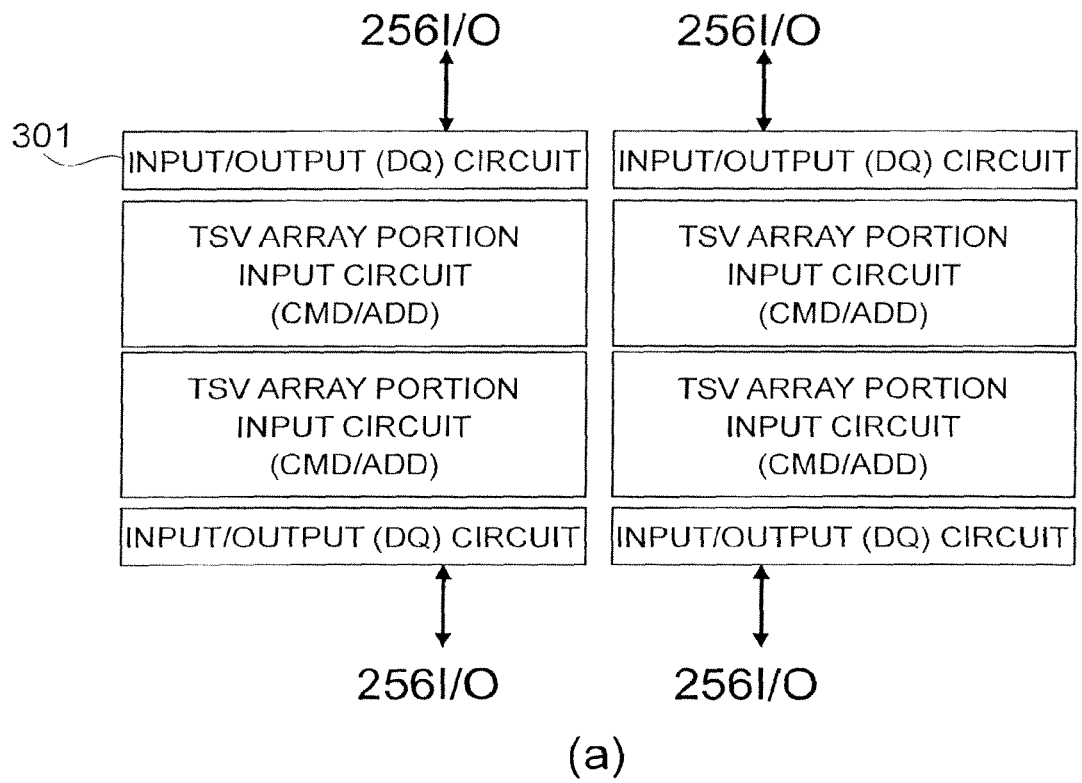
(a)
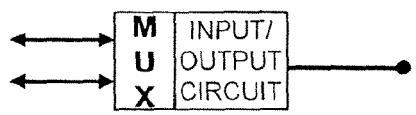
(b)
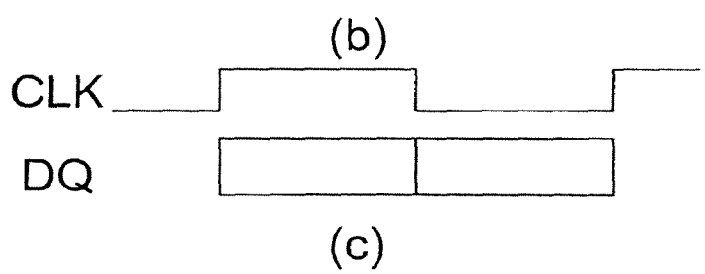
(c)

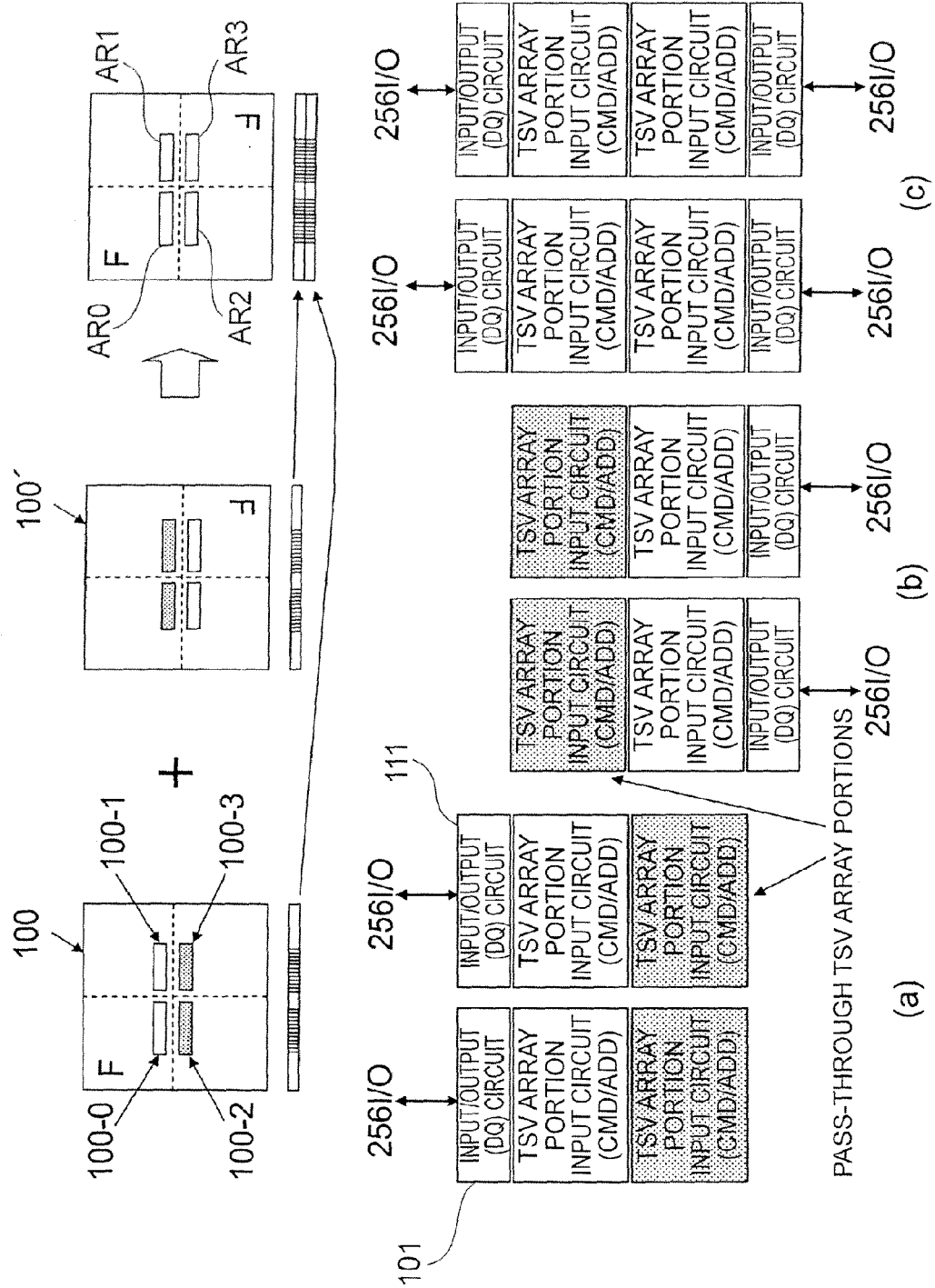

FIG. 6
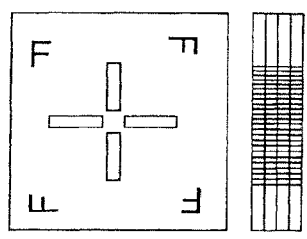
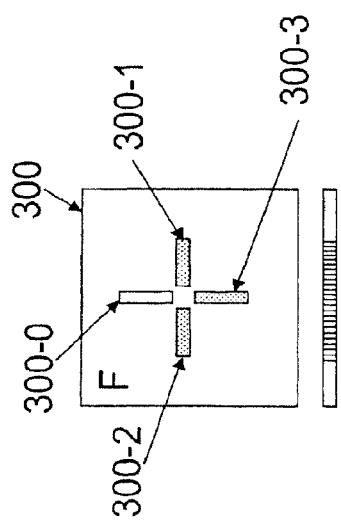
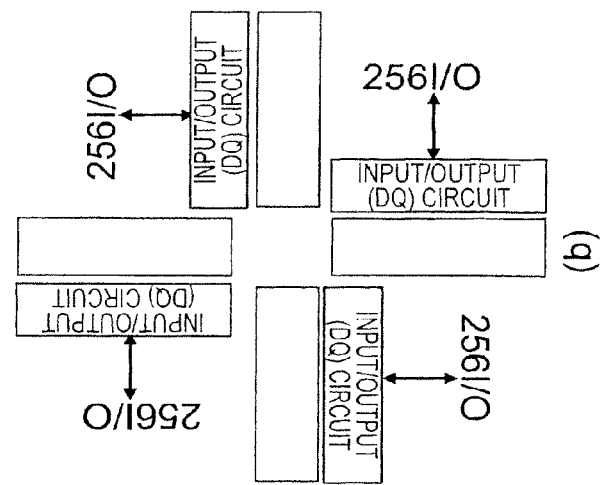
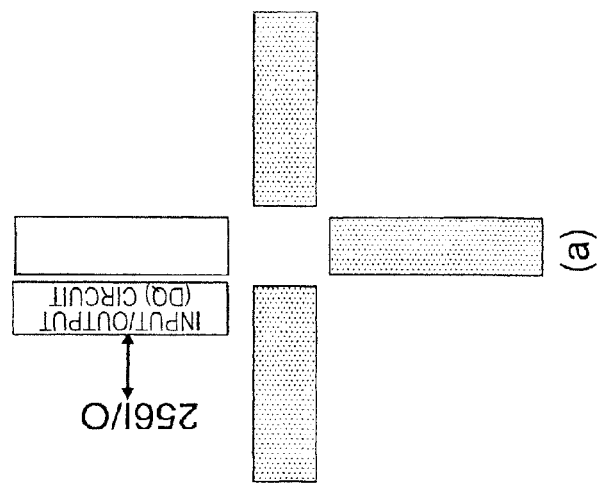

FIG. 8

CONVENTIONAL METHOD

|  | TSV0 | TSV1 | TSV2 | TSV3 |
|---|---|---|---|---|
| S0(CS0) | S0 Ch0 | S0 Ch1 | S0 Ch2 | S0 Ch3 |
| S1(CS1) | S1 Ch0 | S1 Ch1 | S1 Ch2 | S1 Ch3 |

PRESENT INVENTION

|  | TSV0 | TSV1 | TSV2 | TSV3 |
|---|---|---|---|---|
| S0(CS0) | S0 Ch0 | S0 Ch1 | S1 Ch0 | S1 Ch1 |
| S1(CS1) | S0 Ch2 | S0 Ch3 | S1 Ch2 | S1 Ch3 |

S:SLICE   Ch:CHANNEL

IN SLICE 0
TSV0   S0   Ch0   DIRECT
       S1   Ch0 → S0   Ch2
TSV1   S0   Ch1   DIRECT
       S1   Ch1 → S0   Ch3
TSV2   PASSING THROUGH
TSV3   PASSING THROUGH

IN SLICE 1
TSV0   PASSING THROUGH
TSV1   PASSING THROUGH
TSV2   S1   Ch2   DIRECT
       S0   Ch2 → S1   Ch0
TSV3   S1   Ch3   DIRECT
       S0   Ch3 → S1   Ch1

SEMICONDUCTOR DEVICE AND SEMICONDUCTOR CHIP

CROSS-REFERENCE TO RELATED APPLICATIONS

The present application is a Continuation application of U.S. patent application Ser. No. 13/587,724, filed on Aug. 16, 2012, now U.S. Pat. No. 9,087,555 issued on Jul. 21, 2015, which is based upon and claims the benefit of priority from Japanese patent application No. 2011-188141, filed on Aug. 31, 2011, all of which are incorporated herein by reference in their entirety.

BACKGROUND OF THE INVENTION

1. Field of the Invention

The present invention relates to a semiconductor device having a TSV structure and a semiconductor chip having a TSV structure.

2. Description of Related Art

Along with further enhancement of the density of large scale integration (LSI) systems into an ultra-high density, semiconductor devices have been configured three-dimensionally by stacking a plurality of semiconductor chips (e.g., memory chips). For this purpose, a technique of forming a through silicon via (TSV) structure is used. Specifically, through electrodes are formed so as to extend through each of semiconductor chips. Ends of those through electrodes are connected to electrodes of another semiconductor chip. Thus, a three-dimensional TSV structure is formed.

In a TSV structure, when a plurality of semiconductor chips are stacked, those semiconductor chips are connected to each other by through electrodes. Therefore, it is not necessary to provide bonding pads, interposer layers, and the like for connection. Thus, a semiconductor device can further be reduced in size.

Patent Literature: JP2011-029535 A1
Patent Literature: JP2010-282511 A1
Patent Literature: JP2010-282702 A1
Patent Literature: JP2007-036054 A1

SUMMARY

FIGS. 2(a) to 2(c) show an outlined configuration of a currently available wide I/O RAM as an example of a dynamic random access memory (DRAM) that is a semiconductor device using a TSV structure. FIG. 2(a) shows an example of a memory chip. This memory chip has four memory areas for four channels. Each of the memory areas includes an input/output (DQ) circuit and a TSV array portion. Each of the TSV array portions in the chip has 128 input/output pins (DQ pins) and accesses a memory block, which is referred to as a channel in Wide-IO, via an input/output circuit 201 and a 128-bit I/O bus. In FIG. 2(a), an input/output circuit (CMD/ADD) 202 of each of the TSV array portions schematically illustrates a TSV array portion (through electrode array portion) and a command/address input/output circuit. In this circuit, the I/O bus and an internal bus for command/address (CMD/ADD) or the like operate as a synchronous DRAM (SDRAM) interface as shown in FIG. 2(c).

Furthermore, if a double data rate (DDR) interface as shown in FIG. 3(c) is used according to future speed enhancement, for example, each of input/output circuits would need 256 pins as illustrated in FIGS. 3(a) and 3(b) with the DDR technology. Therefore, the I/O buses need 256 bits×4 (because the number of the channels is four). Thus, the I/O bus width becomes double that of FIG. 2(a). Furthermore, each of the input/output (DQ) circuits 301 becomes large because it should operate at a high speed twice the speed of an SDRAM interface. Accordingly, the chip size becomes larger than the configuration of FIG. 2(a).

The present invention seeks to solve one or more of the problems, or to improve upon those problems at least in part.

The present invention is applicable to a semiconductor device having a plurality of chips being stacked with a TSV structure in which adjacent ones of the chips are connected to each other via a plurality of through electrodes.

In one embodiment, there is provided a semiconductor device comprising a plurality of chips being stacked with a TSV structure in which adjacent ones of the chips are connected to each other via a plurality of through electrodes. Each of the chips includes at least one input/output circuit and a plurality of TSV array portions provided with the plurality of through electrodes so as to correspond to a plurality of channels. The plurality of TSV array portions includes a first TSV array portion connected to the at least one input/output circuit so as to contribute to an input and an output of data depending upon the number of the chips being stacked and a second TSV array portion of pass-through, that is not connected to the at least one input/output circuit.

In another embodiment, there is provided a semiconductor chip comprising a first memory cell array and a first through electrode array formed so as to correspond to the first memory cell array. The first through electrode array includes a plurality of through electrodes. The semiconductor chip further comprises a second memory cell array and a second through electrode array formed so as to correspond to the second memory cell array. The second through electrode array includes a plurality of through electrodes. The semiconductor chip still further comprises an I/O circuit connected to electrodes of the first through electrode array that correspond to data to be written into or read from the first or second memory cell array and a control circuit connected to electrodes of the first through electrode array that correspond to a command/address. The control circuit outputs a control signal. The semiconductor chip still further comprises a selector circuit operable to select one of the first and second memory cell arrays based upon the control signal. The selector circuit is provided between the first and second memory cell arrays and the I/O circuit.

According to the present invention, the number and area of input/output circuits of a semiconductor device can be reduced by stacking a plurality of chips.

BRIEF DESCRIPTION OF THE DRAWINGS

The above features and advantages of the present invention will be more apparent from the following description of certain preferred embodiments taken in conjunction with the accompanying drawings, in which:

FIG. 1 is comprised of diagrams (a) and (b) showing an example of a semiconductor device to which the present invention is applicable, with an example of two memory chips having a TSV structure being stacked;

FIG. 2 is comprised of diagrams (a) to (c) showing an outlined configuration of a currently available wide I/O DRAM;

FIG. 3 is comprised of diagrams (a) to (c) showing a configuration of a DRAM with DDR;

FIG. 4 is comprised of diagrams (a) to (c) explanatory of a first embodiment of the present invention in which the present invention has been applied to a two-stage stack of memory chips as illustrated in FIG. 1;

FIG. 6 is comprised of diagrams (a) and (b) explanatory of a second embodiment of the present invention;

FIG. 8 is a diagram showing differences of channels and chips accessed by a conventional access method and channels and chips accessed by a method according to the present invention.

DETAILED DESCRIPTION OF THE PREFERRED EMBODIMENTS

Figure 5A:
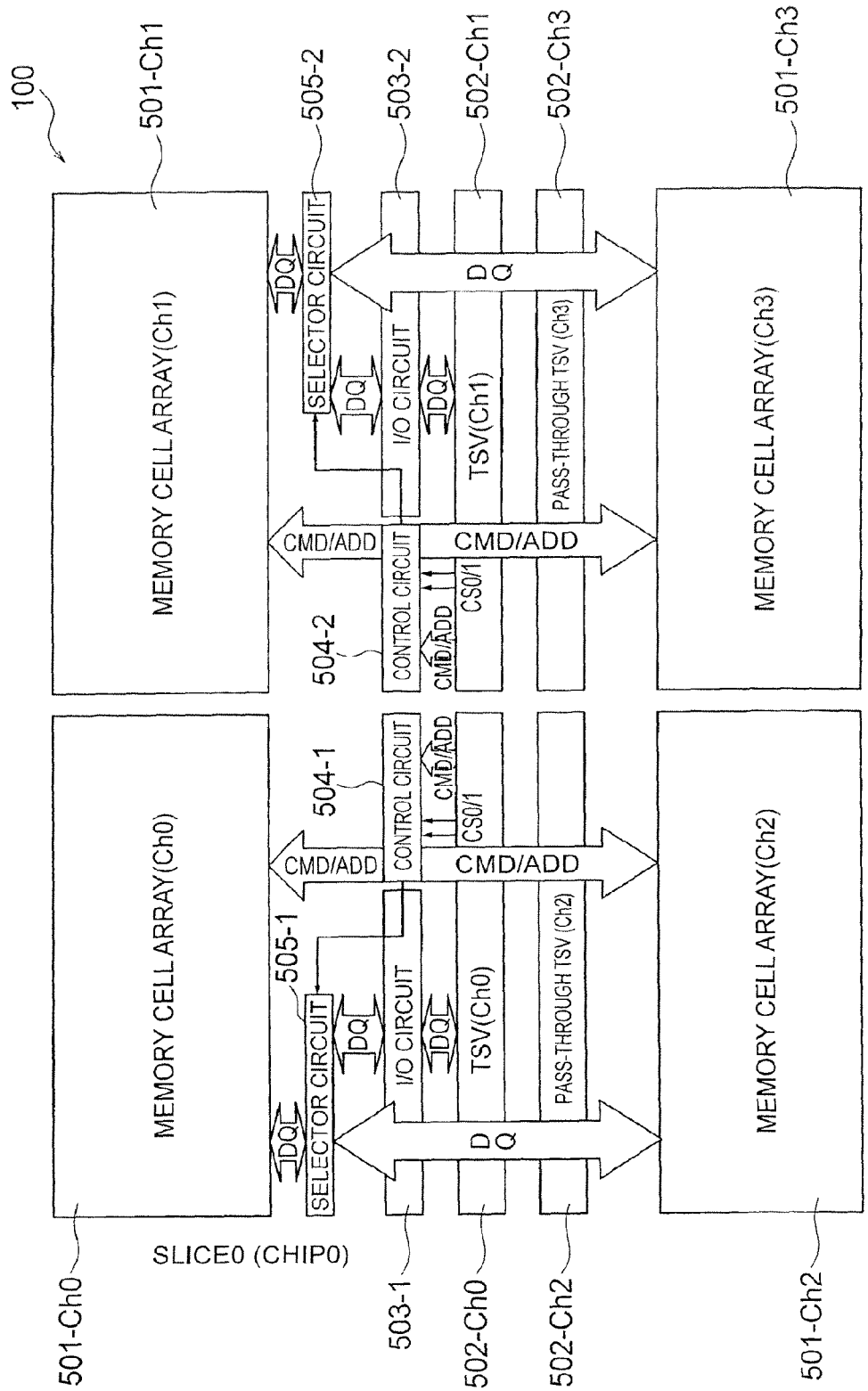
FIGS. 5A and 5B are block diagrams specifically showing the first embodiment of the present invention illustrated in FIG. 4.

The invention will be described herein with reference to illustrative embodiments. Those skilled in the art will recognize that many alternative embodiments can be accomplished using the teachings of the present invention and that the invention is not limited to the embodiments illustrated for explanatory purposes.

Prior to explanation of embodiments of the present invention, an example of a semiconductor device to which the present invention is applied will be described with reference to FIGS. 1(a) and 1(b).

FIGS. 1(a) and 1(b) show an example of a semiconductor device in which two memory chips are stacked. Those memory chips are hereinafter abbreviated to as chips. As a matter of course, the semiconductor device of FIGS. 1(a) and 1(b) is only illustrated by way of example. In FIG. 1(a), a chip 100A has four memory areas of channel 0, channel 1, channel 2, and channel 3. The chip 100A includes TSV array portions 100-0, 100-1, 100-2, and 100-3 provided in the four memory areas, respectively. The TSV array portions 100-0, 100-1, 100-2, and 100-3 are used for connection with input/output (DQ) circuits. The TSV array portions 100-0 and 100-2 are arranged along side edges of the memory area of channel 0 and the memory area of channel 2 that are adjacent to each other. The TSV array portions 100-1 and 100-3 are arranged along side edges of the memory area of channel 1 and the memory area of channel 3 that are adjacent to each other.

In FIG. 1(b), chips 100A and 100B are stacked on a system-on-a-chip (SOC) 200 and packaged by resin. Lines vertically extending through the chip 100A, the chip 100B, and the SOC 200 represent a plurality of through electrodes (through electrode array), which constitute a TSV array portion. Those through electrodes are connected to the exterior of the semiconductor device via solder balls 210 provided on a bottom of the semiconductor device.

The present invention will be described below based upon some embodiments.

First Embodiment

FIGS. 4(a) to 4(c) show a first embodiment of the present invention, in which the present invention has been applied to a two-stage stack of chips (DRAM chips) as described in FIGS. 1(a) and 1(b). Specifically, as described in connection with FIGS. 1(a) and 1(b), a chip 100 has four memory areas of channels 0-3. The four memory areas include TSV array portions 100-0, 100-1, 100-2, and 100-3, respectively. The TSV array portions 100-0 and 100-2 on the left side of FIG. 4(a) are arranged along side edges of adjacent memory areas, and the TSV array portions 100-1 and 100-3 on the right side of FIG. 4(a) are arranged along side edges of adjacent memory areas.

In the first embodiment, as shown in FIG. 4(a), the two TSV array portions 100-0 and 100-1 corresponding to the upper half of the memory areas in the chip 100 are used as TSV array portions for input and output with a DRAM. The two TSV array portions 100-2 and 100-3 corresponding to the lower half of the memory areas in the chip 100 are used as pass-through TSV array portions. In this case, input/output (DQ) circuits 101 and 111 that can cope with four channels are provided only on the TSV array portions 100-0 and 100-1 for input and output with the DRAM. In the case of the two-stage stack, as shown in FIG. 4(b), an upper chip 100' is rotated about 180 degrees and stacked on the lower chip 100. Thus, data are outputted via the pass-through TSV array portions 100-2 and 100-3 of the lower chip 100.

FIG. 4(c) shows a stacked arrangement. Two TSV array portions AR0 and AR1 on an upper half of the memory areas allow the lower chip (FIG. 4(a)) to perform input and output (DQ) with the DRAM, and two TSV array portions AR2 and AR3 on a lower half of the memory areas allow the upper chip (FIG. 4(b)) to perform input and output (DQ) with the DRAM. The stacked two chips operate with 128 DQ×4. In other words, the input/output (DQ) circuits of two of the four channels are used in common (shared), so that the number of the input/output (DQ) circuits in the chips is reduced.

Figure 5B:
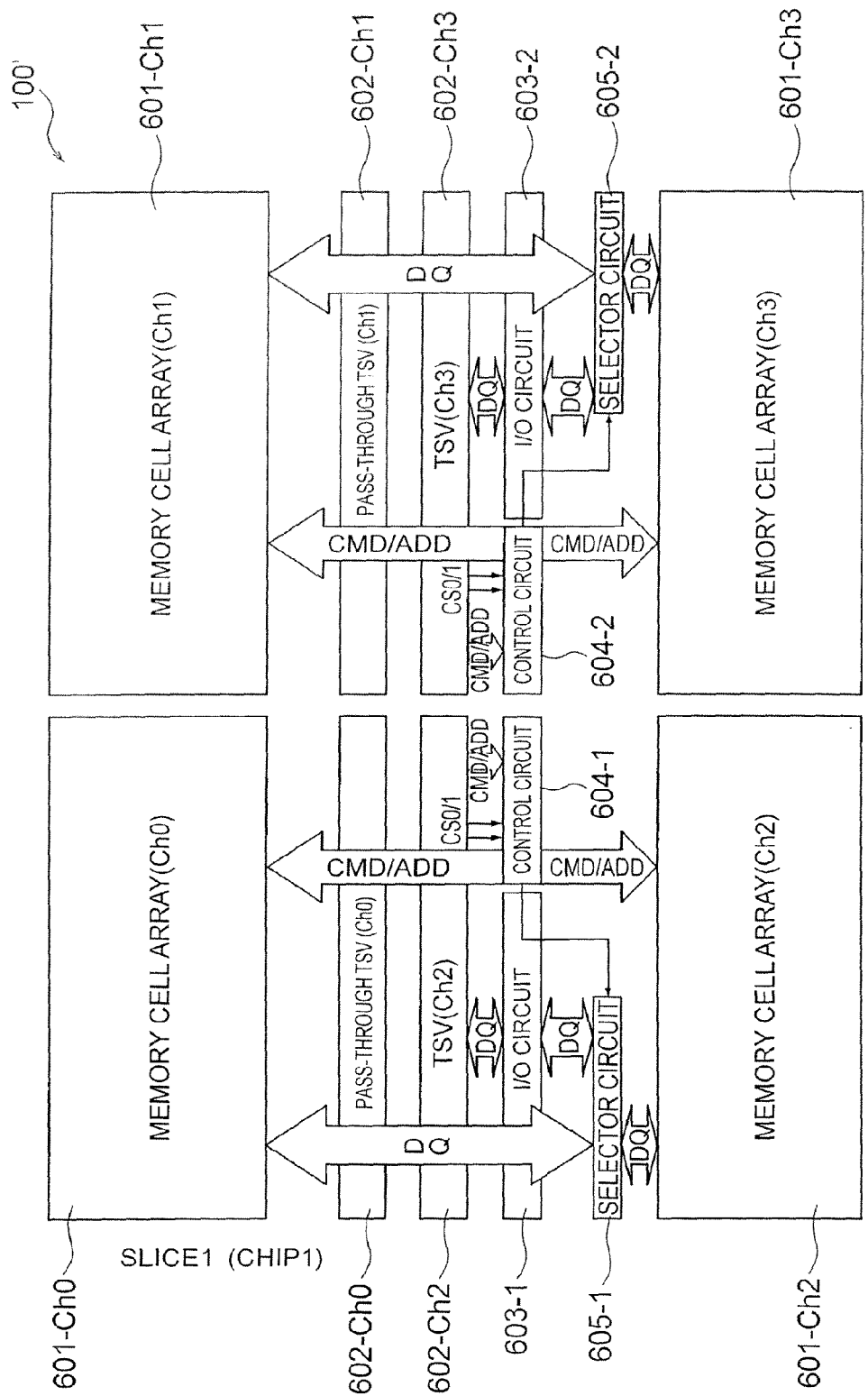

The details of the embodiment will further be described below with reference to FIGS. 5A and 5B, which correspond to FIGS. 4(a) and 4(b), respectively.

The chip 100 has four memory cell arrays 501-Ch0, 501-Ch1, 501-Ch2, and 501-Ch3, which correspond to four channels 0, 1, 2, and 3, respectively. Through electrode array (TSV array) portions 502-Ch0, 502-Ch1, 502-Ch2, and 502-Ch3 are provided so as to correspond to the memory cell arrays 501-Ch0 to 501-Ch3. Among TSVs of the TSV array portion 502-Ch0, TSVs that transmit data signals (DQ signals) are connected to an I/O circuit 503-1, whereas TSVs that transmit command/address signals (CMD/ADD signals) are connected to a control circuit 504-1. The CMD/ADD signals include a chip select signal CS. The I/O circuit 503-1 is connected to a selector circuit 505-1, which connects the I/O circuit 503-1 to one of the memory cell arrays 501-Ch0 and 501-Ch2 based upon a control signals from the control circuit 504-1. In the present embodiment, the control circuit 504-1 and the I/O circuit 503-1 are used in common to the memory cell arrays 501-Ch0 and 501-Ch2. Therefore, no separate control circuit or I/O circuit is provided for the memory cell array 501-Ch2. DQ signals and CMD/ADD signals of the TSV array portions 502-Ch2 and 502-Ch3 are not connected to the chip 100 but are transmitted to the other chip with passing through the TSV array portions 502-Ch2 and 502-Ch3. Nevertheless, power source TSVs of the TSV array portions 502-Ch2 and 502-Ch3 are connected to the memory cell arrays 501-Ch2 and 501-Ch3 for supplying electric power to the memory cell arrays 501-Ch2 and 501-Ch3.

The above explanation can be applied to the TSV array portion 502-Ch1 merely by replacing the memory cell arrays 501-Ch0 and 501-Ch2 with the memory cell arrays 501-Ch1 and 501-Ch3, the I/O circuit 503-1 with an I/O circuit 503-2, the control circuit 504-1 with a control circuit 504-2, and the selector circuit 505-1 with a selector circuit 505-2, respectively. Therefore, the detailed explanation of the TSV array portion 502-Ch1 is omitted herein.

Similarly, the chip 100' has TSV array portions 602-Ch0 to 602-Ch3, which correspond to the TSV array portions 502-

Ch0 to 502-Ch3 of the chip 100. While signals pass through the TSV array portions 502-Ch2 and 502-Ch3 in the chip 100, signals pass through the TSV array portions 602-Ch0 and 602-Ch1 in the chip 100'. DQ signals and the CMD/ADD signals of the TSV array portions 602-Ch0 and 602-Ch1 are not connected to the chip 100' but are transmitted to the other chip with passing through the TSV array portions 602-Ch0 and 602-Ch1. Nevertheless, power source TSVs of the TSV array portions 602-Ch0 and 602-Ch1 are connected to the memory cell arrays 601-Ch0 and 601-Ch1 for supplying electric power to the memory cell arrays 601-Ch0 and 601-Ch1. The chip 100' is substantially the same as the chip 100 except that the TSV array portion 602-Ch2 is connected to a control circuit 604-1 and an I/O circuit 603-1 and that the TSV array portion 602-Ch3 is connected to a control circuit 604-2 and an I/O circuit 603-2. Furthermore, the number of data electrodes corresponding to DQ of each of the TSV array portions 502-Ch0 to 502-Ch3 and 602-Ch0 to 602-Ch3, the number of command electrodes for transmitting a command CMD, the number of address electrodes for transmitting an address ADD, and the number of chip select signals CS0 and CS1 are the same for the chip 100 and the chip 100'. With regard to the example shown in FIG. 5A, the data electrodes, the command electrodes, and the address electrodes are formed such that they are connected to a data bus DQ and a command/address bus CMD/ADD, respectively. The data electrodes, the command electrodes, and the address electrodes correspond to a part of black circles shown in FIG. 1(b).

Operation of the semiconductor device in which the above chips 100 and 100' are stacked will briefly be described below.

When a command/address is inputted to the TSV array portion 502-Ch0 from the memory controller (e.g., the SOC 200 of FIG. 1(b)) and CS0 is inputted as a chip select signal for selecting the chip 100, the control circuit 504-1 of the chip 100 controls the selector circuit 505-1 to connect the memory cell array 501-Ch0 to the I/O circuit 503-1. Thus, it is possible to access the memory cell array 501-Ch0 based upon the command/address. Then, when a command/address is inputted to the TSV array portion 502-Ch0 and the TSV array portion 602-Ch0 and CS1 is inputted as a chip select signal for selecting the chip 100' in order to access the memory cell array 601-Ch0 of the chip 100' from the memory controller, the control circuit 504-1 of the chip 100 controls the selector circuit 505-1 to connect the memory cell array 501-Ch2 to the I/O circuit 503-1. Thus, although it appears that the memory controller accesses the memory cell array 601-Ch0 of the chip 100', it actually accesses the memory cell array 501-Ch2 of the chip 100.

Specifically, the following situations occur in the chip 100 (slice 0).

The memory cell array 501-Ch0 can be accessed by inputting a command/address to the TSV array portion 502-Ch0 along with an input of a chip select signal of CS0 for selecting the chip 100.

The memory cell array 501-Ch2 can be accessed by inputting a command/address to the TSV array portion 502-Ch0 along with an input of a chip select signal of CS1 for selecting the chip 100'.

The memory cell array 501-Ch1 can be accessed by inputting a command/address to the TSV array portion 502-Ch1 along with an input of a chip select signal of CS0 for selecting the chip 100.

The memory cell array 501-Ch3 can be accessed by inputting a command/address to the TSV array-portion 502-Ch1 along with an input of a chip select signal of CS1 for selecting the chip 100'.

Similarly, the following situations occur in the chip 100' (slice 1).

The memory cell array 601-Ch2 can be accessed by inputting a command/address to the TSV array portion 602-Ch2 along with an input of a chip select signal of CS1 for selecting the chip 100'.

The memory cell array 601-Ch0 can be accessed by inputting a command/address to the TSV array portion 602-Ch2 along with an input of a chip select signal of CS0 for selecting the chip 100.

The memory cell array 601-Ch3 can be accessed by inputting a command/address to the TSV array portion 602-Ch3 along with an input of a chip select signal of CS1 for selecting the chip 100'.

The memory cell array 601-Ch1 can be accessed by inputting a command/address to the TSV array portion 602-Ch3 along with an input of a chip select signal of CS0 for selecting the chip 100.

FIG. 8 shows differences of channels and chips accessed by a conventional access method and channels and chips accessed by a method according to the present invention. In FIG. 8, "S0" and "S1" denote the chip 100 and the chip 100', respectively, and "Ch" represents a channel of the chip. For example, "S0 Ch0" means channel 0 of the chip 100.

Advantageous Effects of the First Embodiment

Each channel has heretofore required an I/O circuit and a control circuit. Thus, four I/O circuits and four control circuits have been needed for four channels. With the configuration of the first embodiment, however, the number of I/O circuits and the number of control circuits required can be reduced to two. Therefore, an area of each of the chips can be reduced. Furthermore, the number of I/O circuits connected to the TSV array portions can be reduced according to the number of the stacked chips. Thus, the load capacity of the TSV arrays can also be reduced. Accordingly, if the first embodiment is applied in order to cope with a DDR operation, data buses will have 256×2=512 pins, which are the same as in a currently available wide I/O DRAM illustrated in FIG. 2(a). Although an input/output (DQ) circuit becomes larger because of double-speed operation of an SDRAM interface, the number of circuits can be halved. As a result, the semiconductor device does not need a larger area than the currently-available wide I/O DRAM.

Other Embodiments of the Present Invention

FIGS. 6(a) and 6(b) are diagrams explanatory of a second embodiment of the present invention, which is applied to a case where four chips are stacked. In FIG. 6(a), four TSV array portions 300-0, 300-1, 300-2, and 300-3 are arranged in a cruciate form so as to correspond to four memory areas of channels 0, 1, 2, and 3 in a chip 300 of the second embodiment. The TSV array portion 300-0 serves as a TSV array portion for input and output with a DRAM, and the other TSV array portions 300-1 to 300-3 serve as pass-through TSV array portions. Thus, an input/output (DQ) circuit is used (shared) in common to three channels of the four channels. Therefore, the number of input/output (DQ) circuits in a chip can be reduced to one. In other words, an input/output (DQ) circuit is provided only near the TSV array portion 300-0 for input and output with the DRAM in FIG. 6(a).

Four chips 300 including TSV array portions with such a cruciate arrangement are used. As shown in FIG. 6(b), those chips 300 are stacked in a manner in which the chips are rotated along a surface direction through 90 degrees in a sequential order. Thus, four input/output (DQ) circuits are implemented with a four-stage stack, so that an operation of 128 DQ×4 can be achieved. With this configuration, an internal bus in one chip implements 256 bits, which are half the currently available wide I/O DRAM. The number of the input/output (DQ) circuits becomes %. Thus, a semiconductor device having a smaller area can be achieved.

Figure 7:
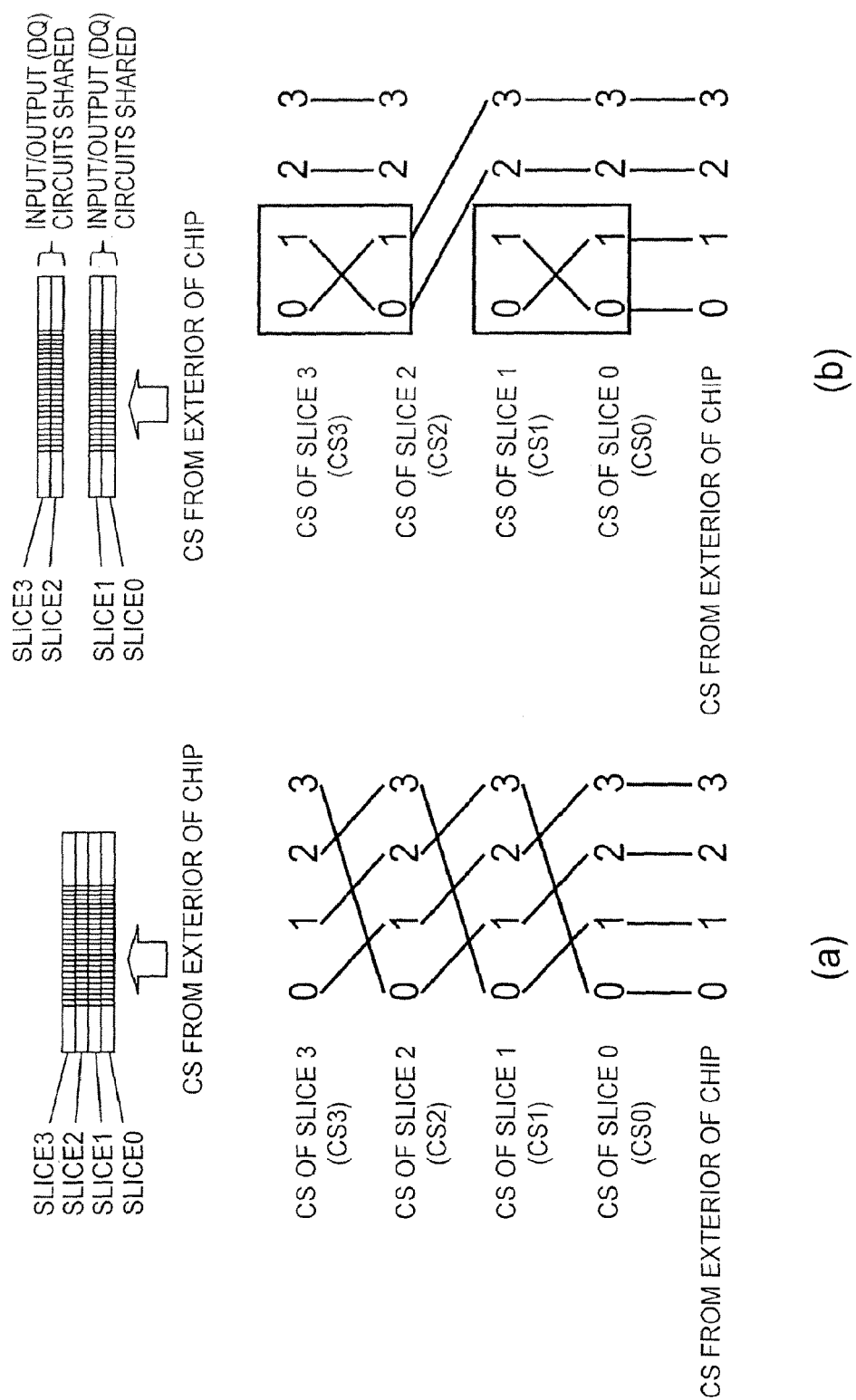
FIG. 7 is comprised of diagrams (a) and (b) explanatory of a CS control when the present invention is applied to a four-stage stack.

FIGS. 7(a) and 7(b) are diagrams explanatory of a chip select (CS) control in a case of a four-stage stack.

FIG. 7(a) shows an example in which each of slices (chips) of a four-stage stack has an input/output circuit. In the case of a four-stage stack, four bits of CS0 to CS3 are used for a chip select signal CS, which selects a chip (slice). The chip select signal CS is transmitted with a spiral structure having an arrangement shifted by one bit in each of different layers. The control circuit provided in each of the chips reads those bits CS0 to CS3 as described in the first embodiment. Therefore, each of the chips can have only one I/O circuit.

FIG. 7(b) shows an example of a CS control in which input/output (DQ) circuits are used in common to a pair of chips adjacent to each other in the stack direction of the four-stage stack. A logical OR is carried out between chips CS0 and CS1 (and chips CS2 and CS3) as seen from the slices, and the input/output (DQ) circuit used in common is turned on (activated). Specifically, the input/output (DQ) circuit of two chips being paired becomes an activated state.

As can be understood from the foregoing description, according to the present invention, two chips of a 2-chip stack structure are stacked in a state in which one of the two chips is rotated along a surface direction through 180 degrees with respect to the other chip. Thus, input/output (DQ) circuits of the lower chip and the upper chip are activated. The chip selected by a chip select (CS) signal performs input and output of data through the input/output (DQ) circuits of the two chips. The same chip may be used for the upper chip and the lower chip. Therefore, it is not necessary to produce two types of chips, and the semiconductor device becomes versatile.

Meanwhile, in the case of a 4-chip stack, four chips are stacked in a state in which the chips are rotated through 90 degrees. Thus, input/output (DQ) circuits of the four chips are always activated.

Although the present invention has been described along with some embodiments, the present invention is not limited to the aforementioned embodiments. It should be understood that various changes and modifications may be made therein without departing from the scope of the present invention.

INDUSTRIAL APPLICABILITY

The present invention is suitable for application to a DRAM, for example, a dual inline memory module (DIMM) DRAM.

What is claimed is:

1. A semiconductor device comprising:
a plurality of chips being stacked with a TSV structure in which adjacent ones of the chips are connected to each other via a plurality of through electrodes, each of the chips including:
at least one input/output circuit; and
a plurality of TSV array portions provided with the plurality of through electrodes so as to correspond to a plurality of channels, the plurality of TSV array portions including a first TSV array portion connected to the at least one input/output circuit so as to contribute to an input and an output of data depending upon the number of the chips being stacked and a second TSV array portion of pass-through, that is not connected to the at least one input/output circuit;
wherein the chips are rotated in a surface direction and stacked depending upon the number of chips being stacked, and an input and an output of data is performed through the pass-through TSV array portion.

2. The semiconductor device as recited in claim 1, wherein each of the first TSV array portion and the second TSV array portion comprises a command electrode for transmitting a command to access a corresponding one of the plurality of channels and an address electrode for transmitting an address.

3. The semiconductor device as recited in claim 1, wherein the first TSV array portion and the second TSV array portion have the same number of electrodes.

4. The semiconductor device as recited in claim 1, wherein a common input/output circuit is provided only on the TSV array portion that contributes to the input and the output of data.

5. The semiconductor device as recited in claim 1, wherein each of the chips includes four TSV array portions corresponding to four channels, the number of the chips being stacked is two, two of the four TSV array portions in each of the chips are used as TSV array portions that contribute to an input and an output of the data, remaining two of the four TSV array portions in each of the chips are used as pass-through TSV array portions, and the chips are stacked in a state in which the chips are rotated through 180 degrees.

6. The semiconductor device as recited in claim 1, wherein each of the chips includes four TSV array portions corresponding to four channels, the number of the chips being stacked is four, one of the four TSV array portions in each of the chips is used as a TSV array portion that contributes to an input and an output of the data, remaining three of the four TSV array portions in each of the chips are used as pass-through TSV array portions, and the chips are stacked in a state in which the chips are rotated through 90 degrees.

7. A semiconductor device comprising:
a plurality of chips being stacked with a TSV structure in which adjacent ones of the chips are connected to each other via a plurality of through electrodes, each of the chips including:
at least one input/output circuit; and
a plurality of TSV array portions provided with the plurality of through electrodes so as to correspond to a plurality of channels, the plurality of TSV array portions including a first TSV array portion connected to the at least one input/output circuit so as to contribute to an input and an output of data depending upon the number of the chips being stacked and a second TSV array portion of pass-through, that is not connected to the at least one input/output circuit;
wherein each of the chips includes four TSV array portions corresponding to at least four channels.

8. The semiconductor device as recited in claim 7, wherein the number of the chips being stacked is two, two of the four TSV array portions in each of the chips are used as TSV array portions that contribute to an input and an output of the data, remaining two of the four TSV array portions in each of the chips are used as pass-through TSV array portions, and the chips are stacked in a state in which the chips are rotated through 180 degrees.

9. The semiconductor device as recited in claim 7, wherein the number of the chips being stacked is four, one of the four TSV array portions in each of the chips is used as a TSV array portion that contributes to an input and an output of the data, remaining three of the four TSV array portions in each of the chips are used as pass-through TSV array portions, and the chips are stacked in a state in which the chips are rotated through 90 degrees.

10. The semiconductor device as recited in claim 7, wherein each of the first TSV array portion and the second TSV array portion comprises a command electrode for transmitting a command to access a corresponding one of the plurality of channels and an address electrode for transmitting an address.

11. The semiconductor device as recited in claim 7, wherein the first TSV array portion and the second TSV array portion have the same number of electrodes.

12. The semiconductor device as recited in claim 7, wherein the chips are rotated in a surface direction and stacked depending upon the number of chips being stacked, and an input and an output of data is performed through the pass-through TSV array portion.

13. The semiconductor device as recited in claim 12, wherein a common input/output circuit is provided only on the TSV array portion that contributes to the input and the output of data.

14. A semiconductor chip comprising:
a first memory cell array;
a first through electrode array formed so as to correspond to the first memory cell array, the first through electrode array including a plurality of through electrodes;
a second memory cell array;
a second through electrode array formed so as to correspond to the second memory cell array, the second through electrode array including a plurality of through electrodes;
a third memory cell array;
a third through electrode array formed so as to correspond to the third memory cell array, the third through electrode array including a plurality of through electrodes;
a fourth memory cell array;
a fourth through electrode array formed so as to correspond to the fourth memory cell array, the fourth through electrode array including a plurality of through electrodes;
a first input/output (I/O) circuit connected to electrodes of the first through electrode array that correspond to data to be written into or read from the first or second memory cell array;
a control circuit connected to electrodes of the first through electrode array that correspond to a command/address, the control circuit outputting a control signal;
a selector circuit operable to select one of the first and second memory cell arrays based upon the control signal, the selector circuit being provided between the first and second memory cell arrays and the I/O circuit; and
a second I/O circuit connected to electrodes of the third through electrode array that correspond to data to be written into or read from the third or fourth memory cell array.

15. The semiconductor chip as recited in claim 14, wherein the control circuit is configured to: receive a first chip select signal for selecting a first chip via the first through electrode array and a second chip select signal for selecting another chip, select one of the first and second memory cell arrays when it receives the first chip select signal, and select the other array of the first and second memory cell arrays when it receives the second chip select signal.

16. The semiconductor chip as recited in claim 14, further comprising:
another control circuit connected to electrodes of the third through electrode array that correspond to a command/address, the other control circuit outputting another control signal; and
another selector circuit operable to select one of the third and fourth memory cell arrays based upon the other control signal, the other selector circuit being provided between the third and fourth memory cell arrays and the second I/O circuit.

* * * * *